United States Patent
Chen et al.

(10) Patent No.: US 10,811,441 B2
(45) Date of Patent: Oct. 20, 2020

(54) PIXEL ARRAY SUBSTRATE

(71) Applicant: Au Optronics Corporation, Hsinchu (TW)

(72) Inventors: Ming-Yao Chen, Hsinchu (TW); Kuo-Yu Huang, Hsinchu County (TW); Wen-Ching Sung, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/441,024

(22) Filed: Jun. 14, 2019

(65) Prior Publication Data
US 2020/0152662 A1    May 14, 2020

(30) Foreign Application Priority Data
Nov. 12, 2018    (TW) .............................. 107140006 A

(51) Int. Cl.
H01L 27/12    (2006.01)
(52) U.S. Cl.
CPC .................................. H01L 27/124 (2013.01)
(58) Field of Classification Search
None
See application file for complete search history.

(56) References Cited

U.S. PATENT DOCUMENTS

| | | | |
|---|---|---|---|
| 7,554,619 B2 | 6/2009 | Lee et al. | |
| 8,872,184 B2 | 10/2014 | Chen et al. | |
| 9,704,896 B2 | 7/2017 | Kim et al. | |
| 2006/0286698 A1* | 12/2006 | Kurashina | H01L 27/1255 438/29 |
| 2009/0195735 A1 | 8/2009 | Huang et al. | |
| 2013/0286304 A1* | 10/2013 | Lin | G02B 30/27 349/15 |

* cited by examiner

*Primary Examiner* — Jay C Chang
(74) *Attorney, Agent, or Firm* — JCIPRNET

(57) ABSTRACT

A pixel array substrate including a substrate, an active device, a planarization layer, a first conductive layer, a first insulation layer and a second conductive layer is provided. The active device is disposed on the substrate. The planarization layer covers the active device and has a first opening. The first conductive layer is disposed on the planarization layer and is electrically connected with a first end of the active device. The first insulation layer is disposed on the first conductive layer. The second conductive layer is disposed on the first insulation layer. The first conductive layer and the second conductive layer cover a side surface of the first opening of the planarization layer.

18 Claims, 8 Drawing Sheets

PIXEL ARRAY SUBSTRATE

CROSS-REFERENCE TO RELATED APPLICATION

This application claims the priority benefit of Taiwan application serial no. 107140006, filed on Nov. 12, 2018. The entirety of the above-mentioned patent application is hereby incorporated by reference herein and made a part of this specification.

BACKGROUND OF THE INVENTION

1. Field of the Invention

The invention relates to a pixel array substrate, and particularly relates to a pixel array substrate suitable for a display apparatus.

2. Description of Related Art

The advanced multimedia technologies nowadays are largely attributable to the development of semiconductor devices and displays. Regarding the displays, liquid crystal displays featuring high definition, low power consumption, and no radiation, etc., have become the mainstream on the market. Through the emergence of diversified applications of the displays, such as the head-mounted display (HMD) used for virtual reality (VR) or even the display panels for (vehicle) projectors, the specification of the resolution of display panels has been rising to provide a more enjoyable visual experience to the user.

Regarding the liquid crystal displays, which are currently the mainstream, through the continuous increase in resolution, in addition to the loss of aperture ratio, the storage capacitor for maintaining the pixel driving potentials is reduced as the space available for circuit layout decreases. As a result, the displayed frame may exhibit issues such as flicker and crosstalk. Therefore, given the limited circuit layout space, how to maintain sufficient pixel storage capacitors has become one of the issues to work on in the development of ultra-high resolution display panel.

SUMMARY OF THE INVENTION

The invention provides a pixel array substrate suitable for an ultra-high resolution display apparatus and having favorable electrical properties.

A pixel array substrate according to an embodiment of the invention includes a substrate, an active device, a planarization layer, a first conductive layer, a first insulation layer and a second conductive layer. The active device is disposed on the substrate. The planarization layer covers the active device and has a first opening. The first conductive layer is disposed on the planarization layer and is electrically connected with a first end of the active device. The first insulation layer is disposed on the first conductive layer. The second conductive layer is disposed on the first insulation layer. The first conductive layer and the second conductive layer cover a side surface of the first opening of the planarization layer.

According to an embodiment of the invention, the first opening of the pixel array substrate has a bottom surface, and the side surface is inclined with respect to the bottom surface.

According to an embodiment of the invention, the pixel array substrate further includes a third conductive layer disposed on the second conductive layer. The third conductive layer is electrically connected with the first conductive layer and overlapped with the first opening.

According to an embodiment of the invention, the pixel array substrate further includes a color filter layer disposed between the second conductive layer and the third conductive layer. The color filter layer has a first part overlapped with the first opening of the planarization and a second part surrounding the first part. The first part has a first thickness, the second part has a second thickness, and the first thickness is greater than the second thickness.

According to an embodiment of the invention, the pixel array substrate further includes a spacer disposed on the third conductive layer. The planarization layer further includes a second opening overlapped with the first end. The spacer is overlapped with the second opening.

According to an embodiment of the invention, the pixel array substrate further includes a color filter layer disposed between the second conductive layer and the third conductive layer. The color filter has a third opening, and the third opening is overlapped with the second opening of the planarization layer.

According to an embodiment of the invention, the third conductive layer of the pixel array substrate covers the second opening of the planarization layer and the third opening of the color filter layer.

According to an embodiment of the invention, the pixel array substrate further includes a first signal line electrically connected with the active device and having a first protruding part and a second protruding part. The first protruding part and the second protruding part of the first signal line are respectively disposed on two opposite sides of the first end of the active device.

According to an embodiment of the invention, the spacer of the pixel array substrate includes a support part and a base part. The base part is disposed between the support part and the planarization layer and located in the second opening. The normal projection area of the base part of the spacer on the substrate is greater than the normal projection area of the support part of the spacer on the substrate.

According to an embodiment of the invention, the base part of the spacer of the pixel array substrate has a top surface, and the top surface protrudes from a portion of an upper surface of the third conductive layer overlapped with the first opening.

According to an embodiment of the invention, the material of the spacer of the pixel array substrate includes a black resin material.

According to an embodiment of the invention, the pixel array substrate further includes a first signal line, and the base part of the spacer covers the first signal line.

According to an embodiment of the invention, the pixel array substrate further includes a metal layer disposed between the third conductive layer and the spacer, and overlapped with the second opening of the planarization layer.

According to an embodiment of the invention, the metal layer of the pixel array substrate is electrically connected with the third conductive layer.

According to an embodiment of the invention, the pixel array substrate further includes a first signal line, and the metal layer of the spacer covers the first signal line.

According to an embodiment of the invention, the pixel array substrate further includes a light shielding layer disposed between the substrate and the active device, and overlapped with the second opening of the planarization layer.

According to an embodiment of the invention, the pixel array substrate further includes a first signal line and a second signal line. The first signal line and the second signal line are disposed to intersect each other on the substrate. The light shielding layer is overlapped with the first signal line and the second signal line.

According to an embodiment of the invention, the material of the light shielding layer of the pixel array substrate includes tantalum, molybdenum, aluminum, or molybdenum oxide.

According to an embodiment of the invention, the reflectivity of the light shielding layer of the pixel array substrate is less than 10%.

According to an embodiment of the invention, the pixel array substrate further includes a second insulation layer disposed between the planarization layer and a semiconductor pattern of the active device and having a first contact hole overlapped with the first end of the active device and a second contact hole overlapped with a second end of the active device. The normal projection of the first end of the active device on the substrate is located within the normal projection of the first contact hole of the second insulation layer on the substrate, and the normal projection of the second end of the active device on the substrate is located within the normal projection of the second contact hole of the second insulation layer on the substrate.

Based on the above, in the pixel array substrate according to the embodiments of the invention, the storage capacitor between the first conductive layer and the second conductive layer is increased by disposing the first conductive layer and the second conductive layer of the pixel structure on the side surface of the first opening of the planarization layer. Accordingly, the display apparatus adopting the pixel array substrate according to the embodiments of the invention has a favorable display quality.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
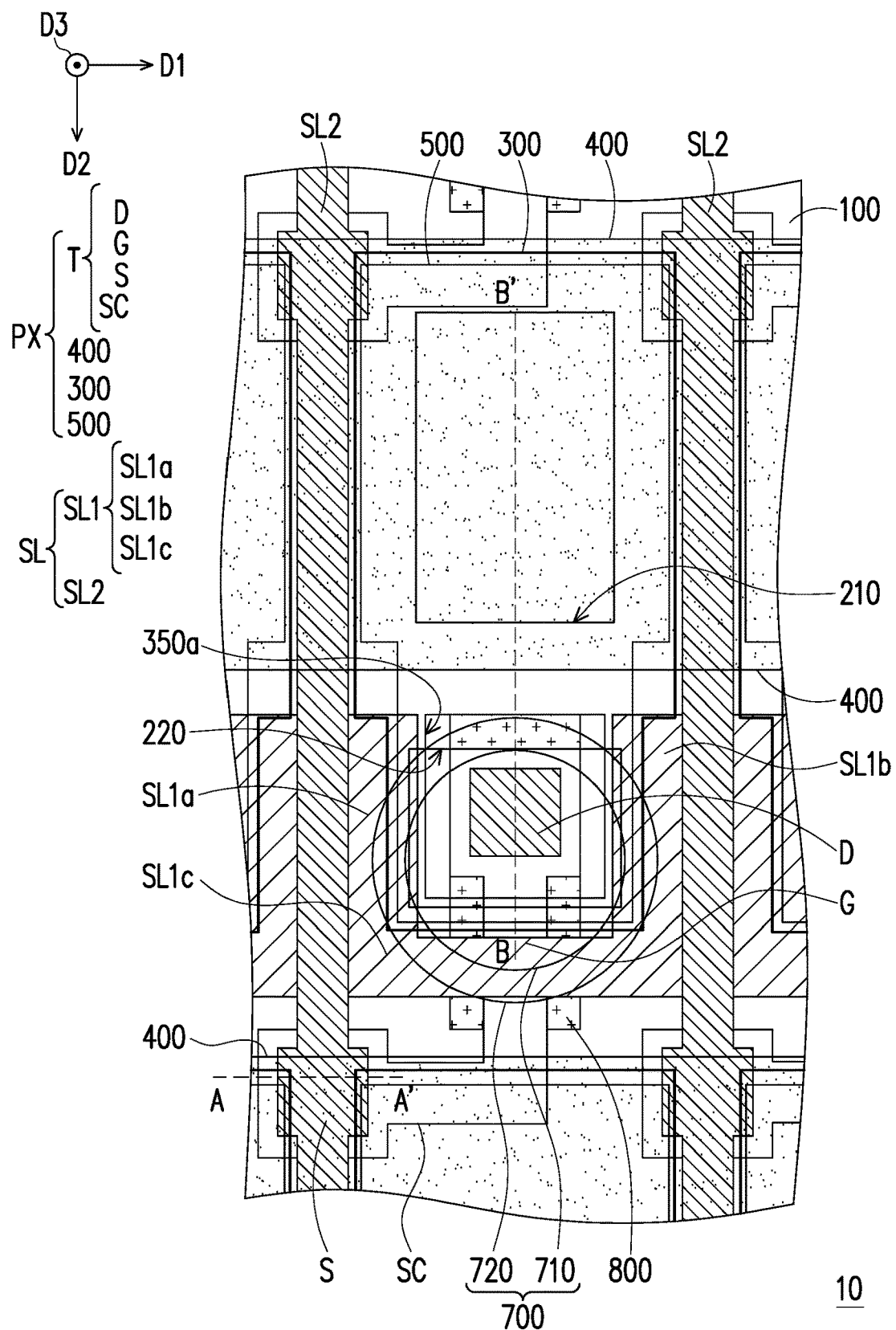
FIG. 1 is a schematic top view illustrating a pixel array substrate according to a first embodiment of the invention.

As used herein, "about," "approximately," "essentially", or "substantially" is inclusive of the stated value and means within an acceptable range of deviation for the particular value as determined by persons of ordinary skill in the art, considering the measurement in question and the error associated with measurement of the particular quantity (i.e., the limitations of the measurement system). For example, "about" may mean within one or more standard deviations, or within, for example, ±30%, ±20%, ±15%, ±10%, ±5% of the stated value. Moreover, a relatively acceptable range of deviation or standard deviation may be chosen for the term "about," "approximately," "essentially" or "substantially" as used herein based on measurement properties, cutting properties or other properties, instead of applying one standard deviation across all the properties.

In the drawings, the thickness of layers, films, panels, regions, etc. are magnified for clarity. It should be understood that when an element is referred to as being "on" or "connected" to another element, the element may be directly on or connected to the other element, or other intermediate elements may exist between the element and the other element. In contrast, when an element is referred to as "directly on another element" or "directly connected to another element", there are no other intermediate elements between the element and the other element. As used herein, "connection" may refer to physical and/or electrical connections. Furthermore, when two elements are "electrically connected", another element may exist between the two elements.

In the disclosure, to facilitate understanding, positions of a source and a drain in a transistor in the drawings are exemplary and not intended to be limiting. The reason is that the source and the drain in the transistor may change with current direction, or may differ depending on whether the transistor is an NMOS transistor or a PMOS transistor.

Reference will now be made in detail to the exemplary embodiments of the invention, examples of which are illustrated in the accompanying drawings. Wherever possible, the same reference numbers are used in the drawings and the description to refer to the same or like parts.

Figure 2:
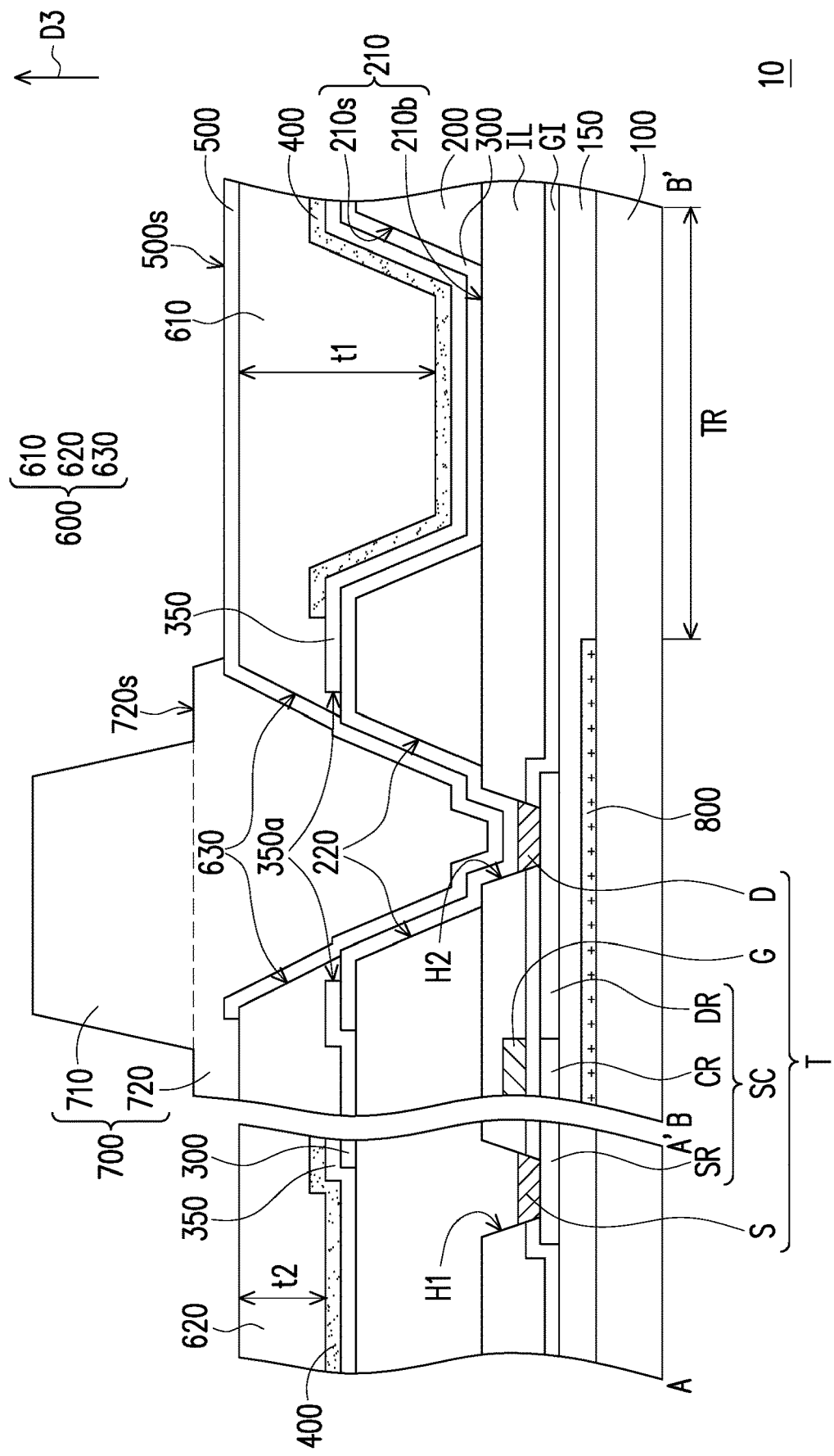
FIG. 2 is a schematic cross-sectional view illustrating the pixel array substrate of FIG. 1.

FIG. 1 is a schematic top view illustrating a pixel array substrate 10 according to a first embodiment of the invention. FIG. 2 is a schematic cross-sectional view illustrating the pixel array substrate 10 of FIG. 1. FIG. 2 corresponds to a sectional line A-A' and a sectional line B-B' of FIG. 1. It should be noted that, for the ease of illustration, an insulation layer 150, a gate insulation layer GI, an interlayer insulation layer IL, a planarization layer 200, a first insulation layer 350, and a color filter layer 600 shown in FIG. 2 are omitted in FIG. 1.

Referring to FIG. 1, the pixel array substrate 10 includes a substrate 100, a plurality of pixel structures PX, and a plurality of signal lines SL. The pixel structures PX are arranged into an array on the substrate 100. In the embodiment, the signal lines SL includes a first signal line SL1 and second signal lines SL2 in FIG. 1. The first signal line SL1 and the second signal line SL2 are disposed to intersect each other on the substrate 100. In the embodiment, the first signal line SL1 is a scan line, for example, and the second signal line SL2 is a data line, for example. In addition, an extending direction D1 of the first signal line SL1 may be substantially perpendicular to an extending direction D2 of the second signal line SL2. However, the invention is not limited thereto.

The pixel structure PX includes an active device T. The active device T includes a semiconductor pattern SC, a source S, a drain D, and a gate G. The gate G and the source S of the active device T are respectively electrically connected with the first signal line SL1 and the second signal line SL2. For example, in the embodiment, the first signal line SL1 has a first protruding part SL1a and a second protruding part SL1b, and the first protruding part SL1a and the second protruding part SL1b are respectively disposed on two opposite sides of the drain D of the active device T, so as to shield leaked light between the two sides of the drain D of the active device T and the corresponding second signal lines SL2. However, the invention is not limited thereto.

Referring to FIG. 2, in the embodiment, the gate G of the active device T may be disposed above the semiconductor pattern SC. In other words, the active device T is a top-gate thin film transistor (top-gate TFT). However, the invention is not limited thereto. In other embodiments, the gate G of the active device T may be disposed below the semiconductor pattern SC. In other words, the active device T may be a bottom-gate TFT.

Specifically, in the embodiment, the active device T may be formed according to the following procedure: sequentially forming the semiconductor pattern SC, the gate insulation layer GI, the gate G, an interlayer insulation layer IL, the source S and the drain D. The semiconductor pattern SC includes a source region SR, a drain region DR, and a channel region CR which may be formed by performing an ion implantation process using the gate G as a mask. The gate G and the channel region CR are overlapped with each other in a direction D3 perpendicular to the substrate 100. The source S is electrically connected with the source region SR via a first contact hole H1 formed in the gate insulation layer GI and the interlayer insulation layer IL. The drain D is electrically connected with the drain region DR via a second contact hole H2 formed in the gate insulation layer GI and the interlayer insulation layer IL. However, the invention is not limited thereto. In some embodiments, the film thickness of the interlayer insulating layer IL may range from 6000 angstroms to 7000 angstroms, but the invention is not limited thereto.

It should be noted that, in a lithography and etching process for forming the source S and the drain D, an exposure amount of a photoresist located in the first contact hole H1 and the second contact hole H2 of the gate insulation layer GI and the interlayer insulation layer IL is smaller than an exposure amount of a photoresist not located in the first contact hole H1 and the second contact hole H2 of the gate insulation layer GI and the interlayer insulation layer IL. Therefore, after development and etching, the source S and the drain D are only respectively formed in the first contact hole H1 and the second contact hole H2 of the gate insulation layer GI and the interlayer insulation layer IL. However, the invention is not limited thereto.

According to other embodiments, in the lithography and etching process for forming the source S and the drain D, a half-tone mask may be optionally adopted for exposure, and the half-tone region of the half-tone mask is overlapped with the first contact hole H1 and the second contact hole H2 of the gate insulation layer GI and the interlayer insulation layer IL. In this way, an exposure amount of the photoresist in the first contact hole H1 and the second contact hole H2 may be further reduced, and the process latitude may thus be increased.

Specifically, in the embodiment, the normal projection of the source S of the active device T on the substrate 100 is located within the normal projection of the first contact hole H1 of the gate insulation layer GI and the interlayer insulation layer IL on the substrate 100, and the normal projection of the drain D of the active device T on the substrate 100 is located within the normal projection of the second contact hole H2 of the gate insulation layer GI and the interlayer insulation IL on the substrate 100. Accordingly, the layout space preserved to prevent circuits from being conducted to each other when one designs the circuits can be reduced, and the pixel resolution of the pixel array substrate can be increased.

In the embodiment, the semiconductor pattern SC, the gate insulation layer GI, the gate G, the interlayer insulation layer IL, the source S, and the drain D may be realized with any semiconductor pattern, any gate insulation layer, any gate, any interlayer insulation layer, any source, and any drain of a pixel array substrate well-known for those having ordinary skills in the art. In addition, the semiconductor pattern SC, the gate insulation layer GI, the gate G, the interlayer insulation layer IL, the source S, and the drain D may be formed by any process well-known for those having ordinary skills in the art. Particularly, in the embodiment, the materials of the gate G and the first signal line SL1 may be the same, and the materials of the source S, the drain D, and the second signal line SL2 may be the same. In other words, the gate G and the first signal line SL1 may be formed at the same layer, and the source S, the drain D, and the second signal line SL2 may be formed at the same layer. However, the invention is not limited thereto.

While the active device T is described by using the low temperature poly-silicon thin film transistor (LPTS TFT) as an example in the embodiment, the invention does not intend to impose a limitation on the type of the active device T. In other embodiments, the active device T may be an amorphous silicon TFT (a-Si TFT), a micro-Si TFT, or a metal oxide transistor.

Referring to FIG. 1 and FIG. 2, the pixel array substrate 10 further includes a planarization layer 200 covering the active device T and having a first opening 210. The first opening 210 of the planarization layer 200 is disposed in a transparent region TR of the pixel array substrate 10. However, the invention is not limited thereto. In other embodiments, the first opening 210 of the planarization layer 200 may be disposed in a region other than the transparent region TR of the pixel array substrate 10. The first opening 210 may have a plurality of side surfaces 210s and a bottom surface 210b arranged between and connecting the side surfaces 210s. For example, in the embodiment, the side surface 210s of the first opening 210 is inclined with respect to the bottom surface 210b. However, the invention is not limited thereto. In some embodiments, the side surface 210s of the first opening 210 may be substantially perpendicular to the bottom surface 210b.

Moreover, the planarization layer 200 further includes a second opening 220 overlapped with the drain D of the active device T. Particularly, in the embodiment, the normal projections of the first opening 210 and the second opening 220 of the planarization layer 200 on the substrate 100 are rectangular, for example. However, the invention is not limited thereto. In other embodiments, the normal projections of the first opening 210 and the second opening 220 of the planarization layer 200 on the substrate 100 may be circular, polygonal, or other suitable shapes.

In the embodiment, the material of the planarization layer 200 includes an organic insulating material, for example. The organic insulating material may include polyimide, polyester, benzocyclobutene (BCB), polymethylmethacrylate (PMMA), poly(4-vinylphenol) (PVP), polyvinyl alcohol (PVA), polytetrafluoroethene (PTFE), hexamethyldisiloxane (HMDSO), or other suitable organic insulating materials.

Referring to FIG. 2, the pixel structure PX further includes a first conductive layer 300, a first insulation layer 350, and a second conductive layer 400 sequentially disposed on the planarization layer 200. The first conductive layer 300 is electrically connected with the drain D of the active device T. Specifically, the first conductive layer 300 covers the second opening 200 of the planarization layer 200 and the first contact hole H1 of the gate insulation layer GI and the interlayer insulation layer IL, so as to be electrically connected with the drain D of the active device T. It should be noted that the first conductive layer 300 and the second conductive layer 400 serve to form a storage capacitor of the pixel structure PX. In addition, with the first conductive layer 300 and the second conductive layer 400 covering the side surfaces 210s and the bottom surface 210b of the first opening 210 of the planarization layer 200, the storage capacitor of the pixel structure PX can be effectively increased. However, the invention is not limited thereto. In some embodiments, the first conductive layer 300 and the second conductive layer 400 may cover only the side surfaces 210s of the first opening 210.

In the embodiment, the first conductive layer 300 and the second conductive layer 400 may be transmissive electrodes. However, the invention is not limited thereto. The material of the transmissive electrode includes metal oxide, such as indium tin oxide (ITO), indium zinc oxide (IZO), aluminum tin oxide, aluminum zinc oxide (AZO), other suitable oxides, or a stacked layer of at least two of the above materials. In the embodiment, the first insulation layer 350 has an opening 350a overlapped with the second opening 220 of the planarization layer 200. The material of the first insulation layer 350 may include an inorganic material (e.g., silicon oxide, silicon nitride, silicon oxynitride, other suitable materials, or a stacked layer of at least two of the above materials), an organic material, other suitable materials, or a combination of the above materials.

The pixel structure PX further includes a third conductive layer 500 disposed on the second conductive layer 400 and electrically connected with the first conductive layer 300. In some embodiments, the third conductive layer 500 is a pixel electrode, for example. However, the invention is not limited thereto. The pixel array substrate 10 may further include the color filter layer 600 disposed between the second conductive layer 400 and the third conductive layer 500. However, the invention is not limited thereto. According to other embodiments, an insulation layer may be adopted to replace the color filter layer 600, so as to electrically isolate the second conductive layer 400 and the third conductive layer 500. In the embodiment, the color filter layer 600 covers the second conductive layer 400 and a portion of the first insulation layer 350. In addition, in the embodiment, the color filter layer 600 may be filled into the opening 350a of the first insulation layer 350 and covers a portion of the first conductive layer 300. However, the invention is not limited thereto.

Moreover, the color filter layer 600 has a first part 610 and a second part 620. The second part 620 of the color filter layer 600 surrounds the first part 610, and the first part 610 is overlapped with the first opening 210 of the planarization layer 200. For example, in the embodiment, the first part 610 of the color filter layer 600 has a first thickness t1 in the direction D3, and the second part 620 of the color filter layer 600 has a second thickness t2 in the direction D3, and the first thickness t1 is greater than the second thickness t2. However, the invention is not limited thereto. In some embodiments, the thickness of the first part 610 of the color filter layer 600 may range from 2 micrometers to 3 micrometers, and the thickness of the second part 620 may range from 1 micrometer to 2 micrometers. It should be noted that, in the embodiment, the second part 620 of the color filter layer 600 is thinner than the first part 610 of the color filter layer 600. Therefore, it is easier to pattern the color filter layer 600 in a lithography and etching process, which helps the pixel array substrate render favorable color performance when the resolution is increased.

The color filter layer 600 further includes a third opening 630 overlapped with the second opening 220 of the planarization layer 200. The third conductive layer 500 covers the third opening 630 of the color filter layer 600 and the second opening 220 of the planarization layer 200, so as to be electrically connected with the first conductive layer 300. Specifically, the third opening 630 of the color filter layer 600 extends in the direction D1. In other words, in the direction D1, two adjacent third openings 630 corresponding to two adjacent pixel structures PX are in communication with each other.

Referring to FIG. 1 and FIG. 2, the pixel array substrate 10 further includes a spacer 700 disposed on the third conductive layer 500 and overlapped with the second opening 220 of the planarization layer 200 and the third opening 630 of the color filter layer 600. Specifically, the spacer 700 includes a support part 710 and a base part 720. The base part 720 is disposed between the support part 710 and the planarization layer 200, and is disposed in the second opening 220 of the planarization layer 200. Particularly, in the embodiment, the normal projection area of the base part 720 of the spacer 700 on the substrate 100 is greater than the normal projection area of the support part 710 of the spacer 700 on the substrate 100. However, the invention is not limited thereto.

In addition, the base part 720 of the spacer 700 has a top surface 720s, and the third conductive layer 500 has a surface 500s overlapped with the first opening 210 of the planarization layer 200. For example, in the embodiment, the top surface 720s of the base part 720 protrudes from the surface 500s of the third conductive layer 500. In other words, there is a step difference between the top surface 720s of the base part 720 and the surface 500s of the third conductive layer 500. However, the invention is not limited thereto. In some embodiments, the top surface 720s of the base part 720 may be aligned with the surface 500s of the third conductive layer 500.

Referring to FIG. 1, in the embodiment, the base part 720 of the spacer 700 may cover the first signal line SL1. Specifically, the first signal line SL1 further includes an extending part SL1c extending in the direction D1 and connected between the first protruding part SL1a and the second protruding part SL1b. In addition, the base part 720 of the spacer 700 covers a portion of the first protruding part SL1a, a portion of the second protruding part SL1b, and a portion of the extending part SL1c of the first signal line SL1. However, the invention is not limited thereto. In other embodiments, the base part 720 of the spacer 700 may cover only a portion of the first protruding part SL1a and a portion of the second protruding part SL1b. For example, in the embodiment, the material of the spacer 700 includes, for example, a photo-sensitive resin composition. However, the invention is not limited thereto.

Referring to FIG. 2, the pixel array substrate 10 may further include a light shielding layer 800 and an insulation layer 150 disposed between the substrate 100 and the active device T. The light shielding layer 800 is overlapped with the second opening 220 of the planarization layer 200. The insulation layer 150 is disposed between the light shielding layer 800 and the active device T and covers the light shielding layer 800 and the substrate 100. For example, in the embodiment, the light shielding layer 800 may be overlapped with the channel region CR and the drain region DR of the semiconductor pattern SC to prevent the semiconductor pattern SC from being degraded through long-term irradiation of the backlight, thereby improving the reliability of the active device T. The material of the light shielding layer 800 may include tantalum, molybdenum, aluminum, the oxide of each of the above materials, or a stack layer of at least two of the above materials. For example, in the embodiment, the material of the light shielding layer 800 may include, for example, a stack layer of molybdenum oxide doped with tantalum ($MoO_x$:Ta) and molybdenum. In some embodiments, the material of the light shielding layer 800 may include, for example, a stack layer of molybdenum oxide doped with tantalum ($MoO_x$:Ta) and aluminum.

Figure 3:
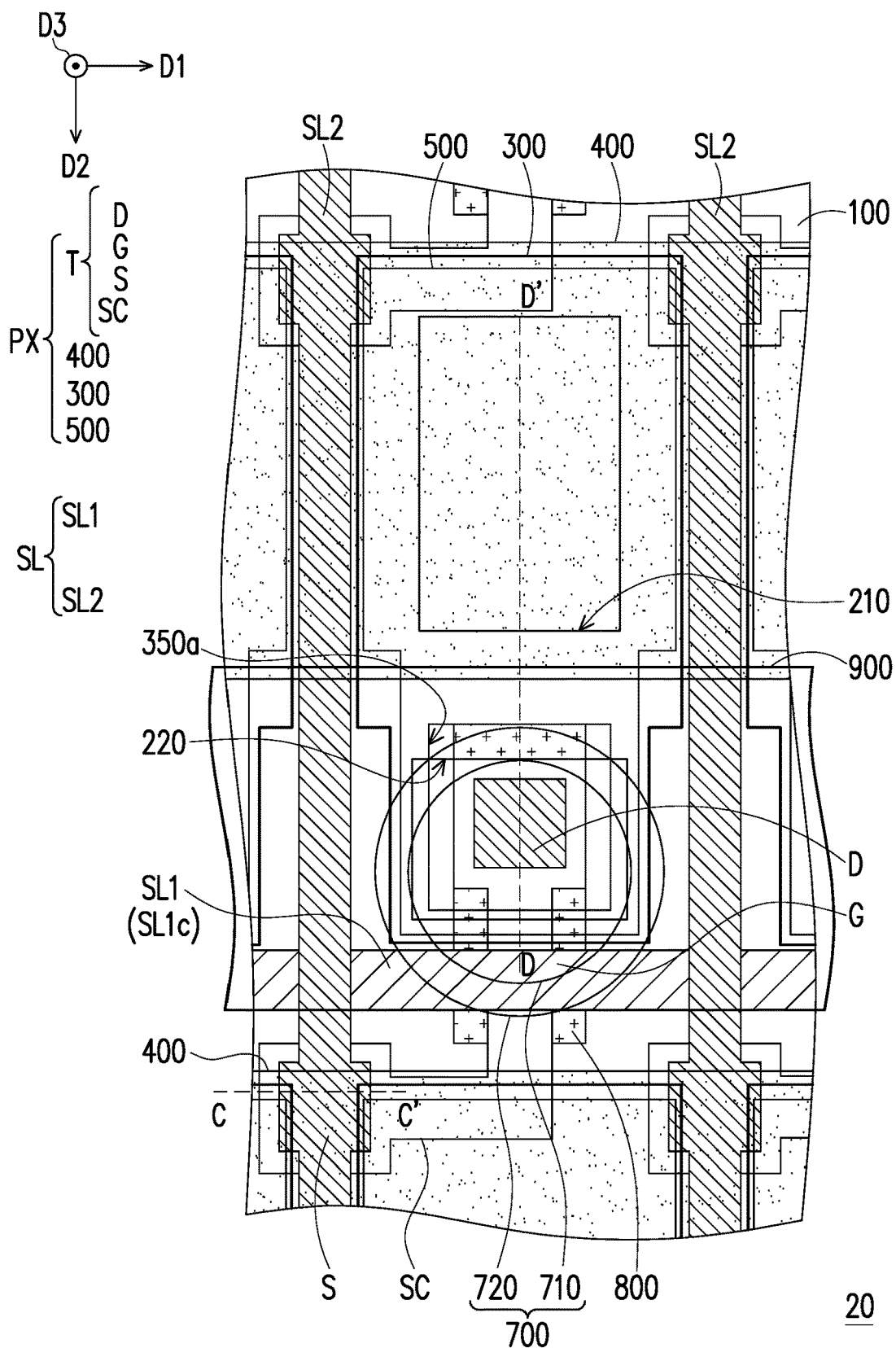
FIG. 3 is a schematic top view illustrating a pixel array substrate according to a second embodiment of the invention.
Figure 4:
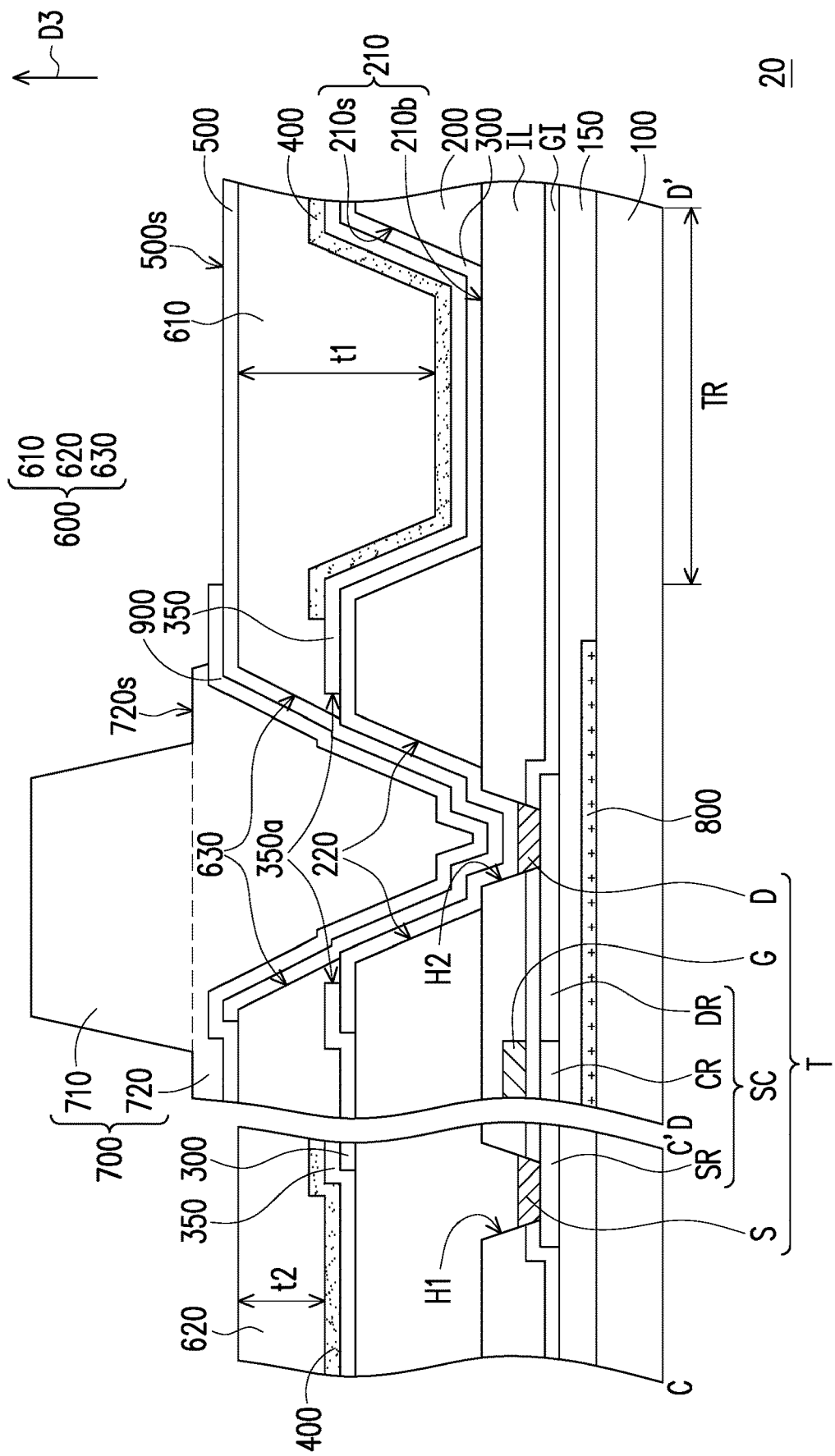
FIG. 4 is a schematic cross-sectional view illustrating the pixel array substrate of FIG. 3.

FIG. 3 is a schematic top view illustrating a pixel array substrate 20 according to a second embodiment of the invention. FIG. 4 is a schematic cross-sectional view illustrating the pixel array substrate 20 of FIG. 3. FIG. 4 corresponds to a sectional line C-C' and a sectional line D-D' of FIG. 3. It should be noted that, for the ease of illustration, the insulation layer 150, the gate insulation layer GI, the interlayer insulation layer IL, the planarization layer 200, the first insulation layer 350, and the color filter layer 600 shown in FIG. 4 are omitted in FIG. 3.

Referring to FIG. 3 and FIG. 4, the pixel array substrate 20 of the embodiment differs from the pixel array substrate 10 shown in FIG. 1 and FIG. 2 in that the first signal line SL1 of the pixel array substrate 20 only includes the extending part SL1c, and the pixel array substrate 20 further includes a metal layer 900 disposed between the third conductive layer 500 and the spacer 700 and overlapped with the second opening 220 of the planarization layer 200.

In the embodiment, the metal layer 900 of the pixel array substrate 20 covers the third opening 630 of the color filter layer 600 and the second opening 220 of the planarization layer 200, so as to be electrically connected with the third conductive layer 500. For example, in the embodiment, the metal layer 900 extends in the direction D1 and covers the first signal line SL1. However, the invention is not limited thereto. In some embodiments, the metal layer 900 only covers a portion of the first signal line SL1 in the direction D2. It should be noted that, in the embodiment, the metal layer 900 serves to replace the conventional black matrix (BM), so as to shield the leaked light between the drain D of the active device T and the signal line SL.

Figure 5:
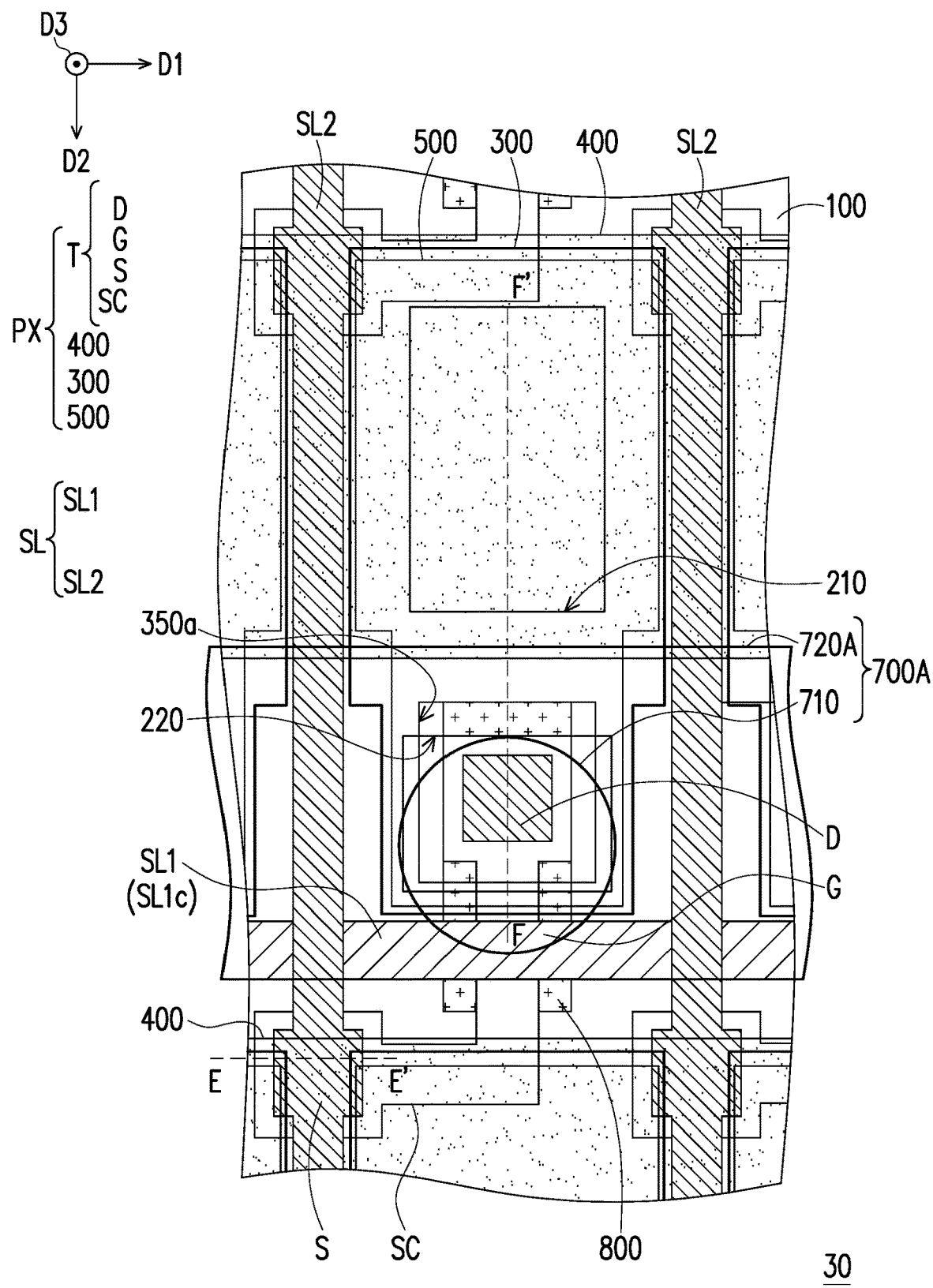
FIG. 5 is a schematic top view illustrating a pixel array substrate according to a third embodiment of the invention.
Figure 6:
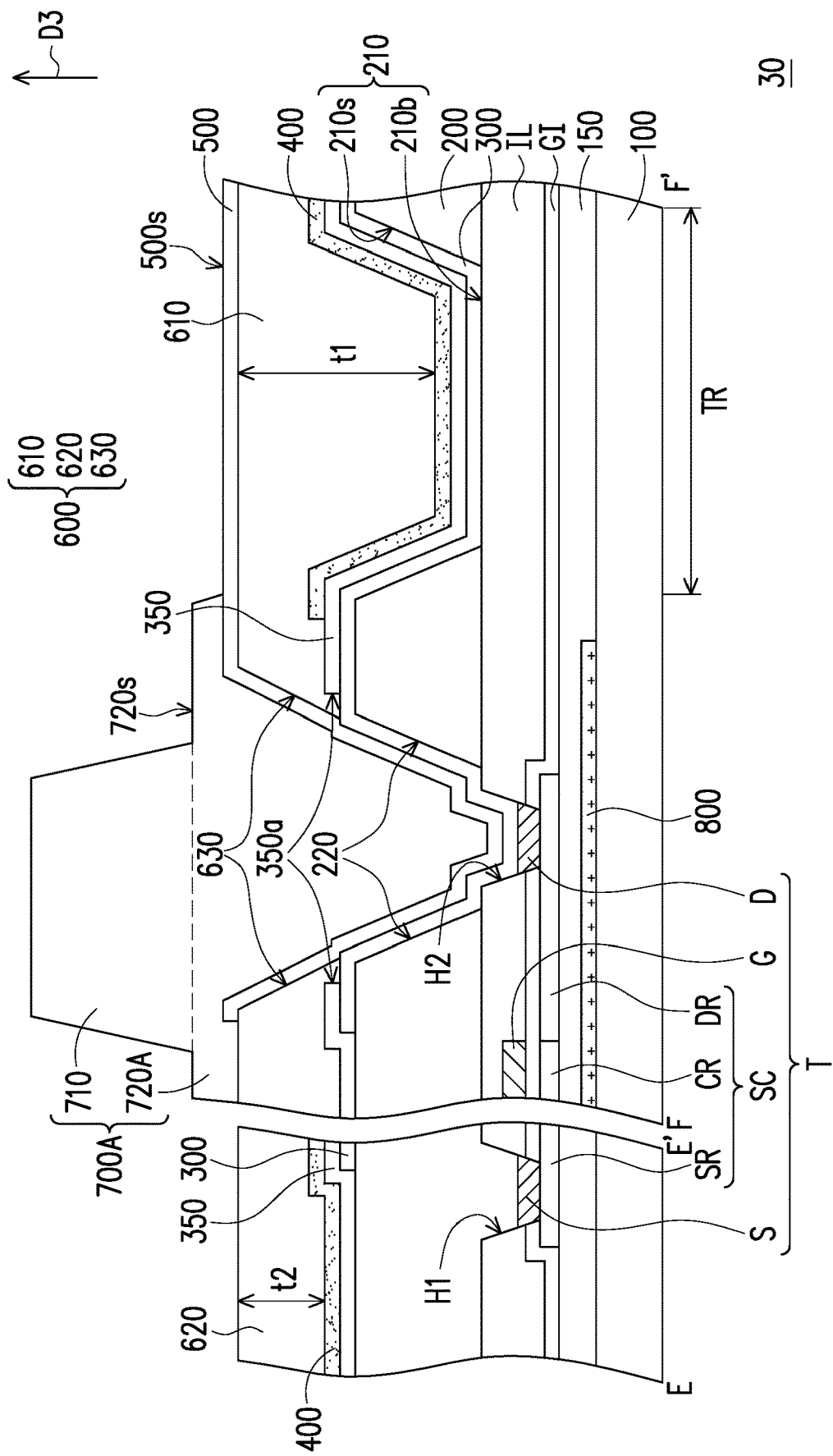
FIG. 6 is a schematic cross-sectional view illustrating the pixel array substrate of FIG. 5.

FIG. 5 is a schematic top view illustrating a pixel array substrate 30 according to a third embodiment of the invention. FIG. 6 is a schematic cross-sectional view illustrating the pixel array substrate 30 of FIG. 5. FIG. 6 corresponds to a sectional line E-E' and a sectional line F-F' of FIG. 5. It should be noted that, for the ease of illustration, the insulation layer 150, the gate insulation layer GI, the interlayer insulation layer IL, the planarization layer 200, the first insulation layer 350, and the color filter layer 600 shown in FIG. 6 are omitted in FIG. 5.

Referring to FIG. 5 and FIG. 6, the pixel array substrate 30 of the embodiment differs from the pixel array substrate 10 shown in FIG. 1 and FIG. 2 in that the first signal line SL1 of the pixel array substrate 30 only includes the extending part SL1c, and a base part 720A of a spacer 700A of the pixel array substrate 30 fills the third opening 630 of the color filter layer 600 and the second opening 220 of the planarization layer 200.

In the embodiment, the material of the spacer 700A may include a black resin material, and the base part 720A of the spacer 700A extends in the direction D1. Specifically, the base part 720A of the spacer 700A covers the first signal line SL1, a portion of the second signal line SL2, and the drain D of the active device T. Accordingly, the base part 720A of the spacer 700A may replace the conventional black matrix to shield the leaked light between the drain D of the active device T and the signal line SL.

Figure 7:
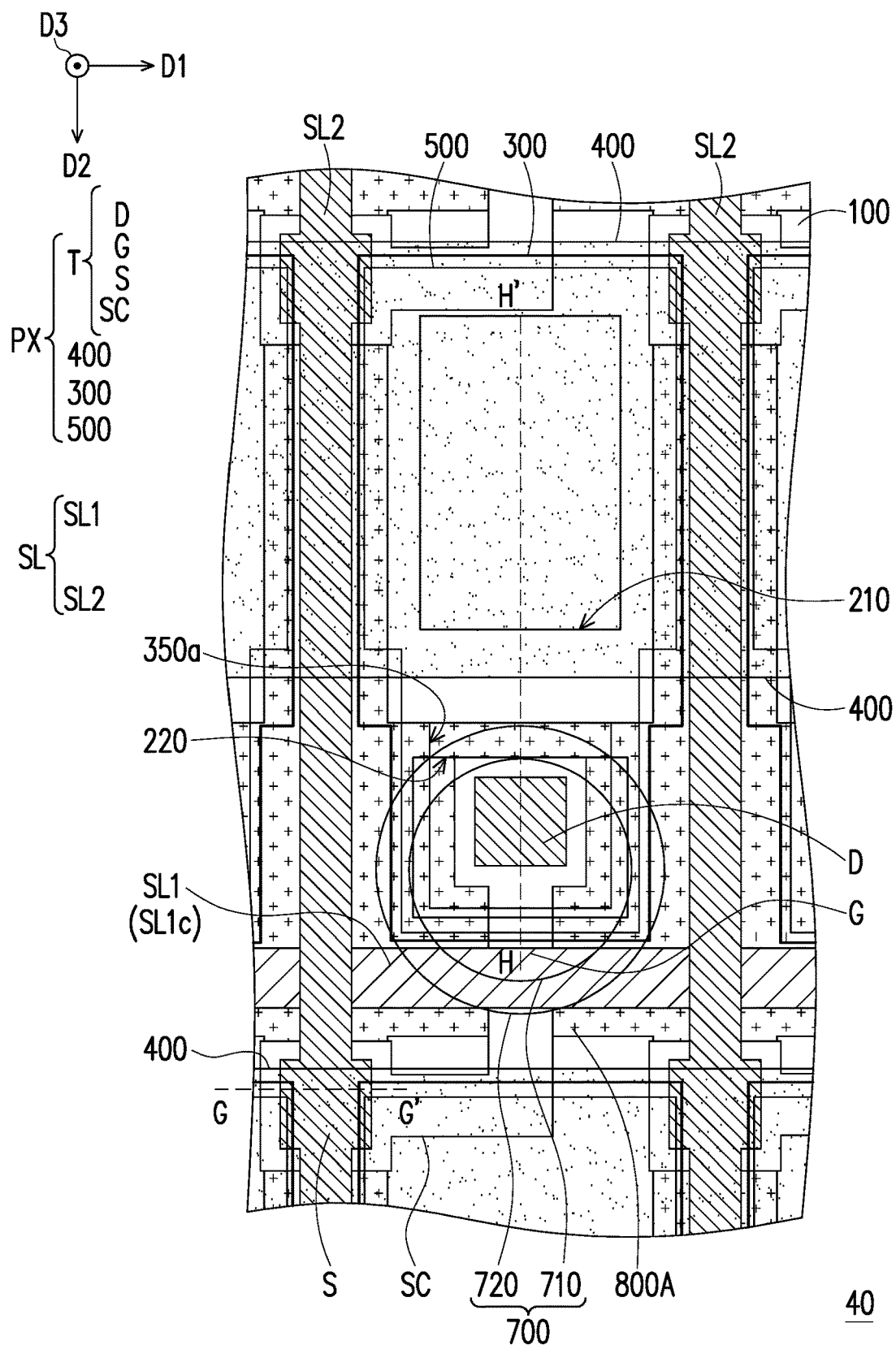
FIG. 7 is a schematic top view illustrating a pixel array substrate according to a fourth embodiment of the invention.
Figure 8:
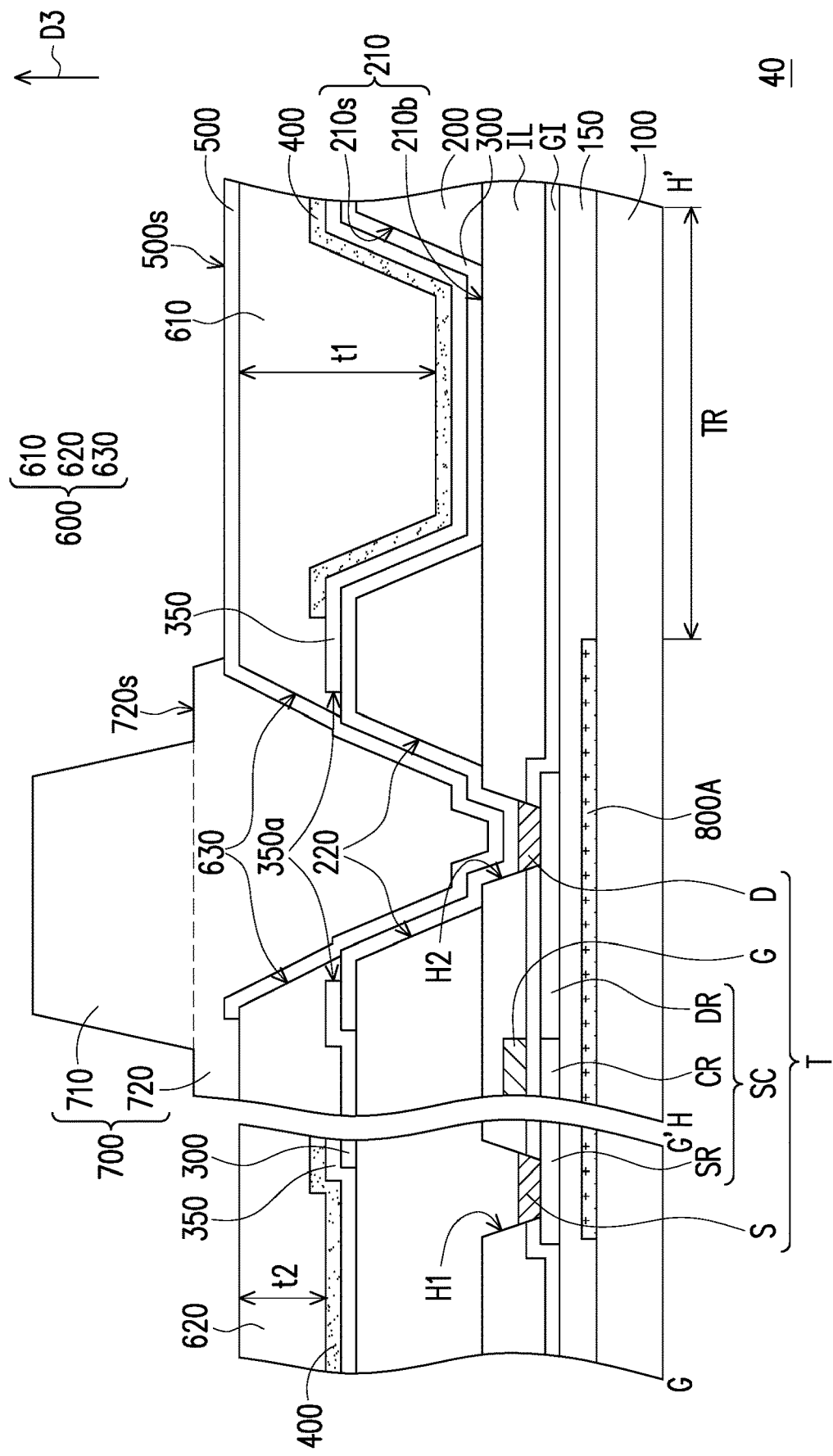
FIG. 8 is a schematic cross-sectional view illustrating the pixel array substrate of FIG. 7.

FIG. 7 is a schematic top view illustrating a pixel array substrate 40 according to a fourth embodiment of the invention. FIG. 8 is a schematic cross-sectional view illustrating the pixel array substrate 40 of FIG. 7. FIG. 8 corresponds to a sectional line G-G' and a sectional line H-H' of FIG. 7. It should be noted that, for the ease of illustration, the insulation layer 150, the gate insulation layer GI, the interlayer insulation layer IL, the planarization layer 200, the first insulation layer 350, and the color filter layer 600 shown in FIG. 8 are omitted in FIG. 7.

Referring to FIG. 7 and FIG. 8, the pixel array substrate 40 of the embodiment differs from the pixel array substrate 10 shown in FIG. 1 and FIG. 2 in that the first signal line SL1 of the pixel array substrate 40 only includes the extending part SL1c, and a light shielding layer 800A of the pixel array substrate 40 is further overlapped with the first signal line SL1, the second signal line SL2, and the source S of the active device T. In other words, the light shielding layer 800A may replace the conventional black matrix to shield the leaked light between the drain D of the active device T and the signal line SL. For example, in the embodiment, the reflectivity of the light shielding layer 800A is less than 10%. Therefore, the visibility of the light shielding layer 800A under the irradiation of ambient light can be reduced. In this way, the dark-state performance of the display apparatus adopting the pixel array substrate 40 can be improved.

In view of the foregoing, in the pixel array substrate according to the embodiments of the invention, the storage capacitor between the first conductive layer and the second conductive layer is increased by disposing the first conductive layer and the second conductive layer of the pixel structure on the side surface of the first opening of the planarization layer. Accordingly, the display apparatus adopting the pixel array substrate according to the embodiments of the invention has a favorable display quality.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A pixel array substrate, comprising:
a substrate;
an active device, disposed on the substrate;
a planarization layer, covering the active device and having a first opening;
a first conductive layer, disposed on the planarization layer and electrically connected with a first end of the active device;
a first insulation layer, disposed on the first conductive layer;
a second conductive layer, disposed on the first insulation layer, wherein the first conductive layer and the second conductive layer cover a side surface of the first opening of the planarization layer;
a third conductive layer, disposed on the second conductive layer, wherein the third conductive layer is elec- trically connected with the first conductive layer and overlapped with the first opening; and a color filter layer, disposed between the second conductive layer and the third conductive layer and having a first part overlapped with the first opening and a second part surrounding the first part, wherein the first part has a first thickness, the second part has a second thickness, and the first thickness is greater than the second thickness.

2. The pixel array substrate as claimed in claim 1, wherein the first opening has a bottom surface, and the side surface is inclined with respect to the bottom surface.

3. The pixel array substrate as claimed in claim 1, further comprising:

a spacer, disposed on the third conductive layer, wherein the planarization layer further comprises a second opening overlapped with the first end, and the spacer is overlapped with the second opening.

4. The pixel array substrate as claimed in claim 3, wherein the color filter layer has a third opening, and the third opening is overlapped with the second opening of the planarization layer.

5. The pixel array substrate as claimed in claim 4, wherein the third conductive layer covers the second opening of the planarization layer and the third opening of the color filter layer.

6. The pixel array substrate as claimed in claim 3, further comprising:

a first signal line, electrically connected with the active device and having a first protruding part and a second protruding part, wherein the first protruding part and the second protruding part are respectively disposed on two opposite sides of the first end of the active device.

7. The pixel array substrate as claimed in claim 3, wherein the spacer comprises:

a support part; and a base part, disposed between the support part and the planarization layer and located in the second opening, wherein a normal projection area of the base part of the spacer on the substrate is greater than a normal projection area of the support part of the spacer on the substrate.

8. The pixel array substrate as claimed in claim 7, wherein the base part of the spacer has a top surface, and the top surface protrudes from a portion of an upper surface of the third conductive layer overlapped with the first opening.

9. The pixel array substrate as claimed in claim 3, further comprising:

a metal layer, disposed between the third conductive layer and the spacer, and overlapped with the second opening of the planarization layer.

10. The pixel array substrate as claimed in claim 9, wherein the metal layer is electrically connected with the third conductive layer.

11. The pixel array substrate as claimed in claim 9, further comprising a first signal line, wherein the metal layer covers the first signal line.

12. The pixel array substrate as claimed in claim 3, wherein a material of the spacer comprises a black resin material.

13. The pixel array substrate as claimed in claim 12, further comprising a first signal line, wherein a base part of the spacer covers the first signal line.

14. The pixel array substrate as claimed in claim 3, further comprising:

a light shielding layer, disposed between the substrate and the active device and overlapped with the second opening of the planarization layer.

15. The pixel array substrate as claimed in claim 14, further comprising:

a first signal line and a second signal line, disposed to intersect each other on the substrate, wherein the light shielding layer is overlapped with the first signal line and the second signal line.

16. The pixel array substrate as claimed in claim 14, wherein a material of the light shielding layer comprises tantalum, molybdenum, aluminum, or molybdenum oxide.

17. The pixel array substrate as claimed in claim 14, wherein a reflectivity of the light shielding layer is less than 10%.

18. The pixel array substrate as claimed in claim 1, further comprising:

a second insulation layer, disposed between the planarization layer and a semiconductor pattern of the active device, and having a first contact hole overlapped with the first end of the active device and a second contact hole overlapped with a second end of the active device, wherein a normal projection of the first end of the active device on the substrate is located within a normal projection of the first contact hole of the second insulation layer on the substrate, and a normal projection of the second end of the active device on the substrate is located within a normal projection of the second contact hole of the second insulation layer on the substrate.

* * * * *